(12) United States Patent
Azeroual et al.

(10) Patent No.: US 8,164,348 B1
(45) Date of Patent: Apr. 24, 2012

(54) METHOD AND APPARATUS FOR TUNING DELAY

(75) Inventors: Dan Azeroual, Kiriat Ata (IL); Meir Hasko, D.N Misgav (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 520 days.

(21) Appl. No.: 12/367,983

(22) Filed: Feb. 9, 2009

Related U.S. Application Data (60) Provisional application No. 61/028,673, filed on Feb. 14, 2008, provisional application No. 61/119,517, filed on Dec. 3, 2008.

(51) Int. Cl.
*G01R 27/04* (2006.01)

(52) U.S. Cl. ................................ 324/639; 324/538

(58) Field of Classification Search .................. 324/538, 324/639, 76.35; 327/261, 269
See application file for complete search history.

(56) References Cited

U.S. PATENT DOCUMENTS

| 2008/0048747 A1* | 2/2008 | Iizuka .......................... 327/261 |
| 2008/0297221 A1* | 12/2008 | Denda et al. .................. 327/276 |

* cited by examiner

*Primary Examiner* — Vincent Q Nguyen (57) ABSTRACT

Aspects of the disclosure can provide an integrated circuit (IC) chip. The IC chip may adjust delays at its interface to compensate for outside transmission line delays. The interface of the IC chip can include a plurality of input/output (IO) modules coupled to a plurality of outside transmission lines, respectively. Each of the IO module can further include at least one variable delay element configured to delay transmission over the corresponding outside transmission line based on an actually measured transmission delay of the outside transmission line, in order to align signals transmitted by the plurality of outside transmission lines in a desired manner.

12 Claims, 7 Drawing Sheets

METHOD AND APPARATUS FOR TUNING DELAY

INCORPORATION BY REFERENCE

This application claims the benefit of U.S. Provisional Application No. 61/028,673, "Transition Line Delay Measurement" filed on Feb. 14, 2008, and U.S. Provisional Application No. 61/119,517, "Transition Line Delay Measurement Circuit Using Regular Digital IO Pad" filed on Dec. 3, 2008, which are incorporated herein by reference in their entirety.

BACKGROUND

Parallel buses, such as data bus, address bus, control bus, and the like, can be used to transmit multiple bits in parallel. Generally, it can be preferred that the multiple bits can be synchronized with substantially equal delays at various connector levels, such as integrated circuit pads, printed circuit board (PCB) connectors, and the like. In a technique to synchronize the delays of the multiple bits, layout engineers may route the multiple bits based on simulation reports. The simulation based technique may increase time to market, and may introduce errors, for example, due to lack of accuracy of models used in the simulation.

SUMMARY

Aspects of the disclosure can provide a method and an apparatus to measure transmission line delays in a package device or a printed circuit board coupled to an integrated circuit, and adjust the transmission line delays based on the measurements. Adjustment of the delays may be performed in an interface of an integrated circuit. Thus, layout time and delivery time for the package device or the printed circuit board can be reduced, and transmission line delays can be adjusted with increased accuracy.

Aspects of the disclosure can provide an interface for a device to compensate for outside transmission line delays. The interface can include a plurality of connector modules coupled to a plurality of outside transmission lines, respectively. Each connector module can include at least one variable delay element configured to delay signals transmitted over the corresponding outside transmission line based on an actually measured transmission delay of the outside transmission line, in order to align signals transmitted by the plurality of outside transmission lines in a desired manner.

Further, each connector module can measure the transmission delay by driving a test signal over the outside transmission line and measuring a timing of the test signal reflected over the outside transmission line during a calibration stage.

According to the disclosure, the connector module can include a detector configured to detect the test signal reflected over the outside transmission line based on a voltage level on the connector module in order to measure a total time for the test signal transmitted and reflected over the outside transmission line. Further, the detector can include a comparator configured to compare the voltage level on the connector module with a reference voltage.

In addition, the detector may detect the test signal before transmission onto the outside transmission line in order to measure a transmission time within the device. Accordingly, the transmission delay of the outside transmission line can be calculated by subtracting the total time with the transmission time within the device.

According to an embodiment of the disclosure, the variable delay element can be located on an output path for outputting signals onto the outside transmission line. According to another embodiment of the disclosure, the variable delay element can be located on an input path for receiving signals from the first outside transmission line.

According to the disclosure, the test signal comprises at least one of a positive voltage step, a negative voltage step, and a pulse. In addition, the outside transmission line can be configured in an open configuration during the calibration stage.

Aspects of the disclosure can provide an integrated circuit (IC) chip. The IC chip can include a first input/output (IO) pad module coupled to a first outside transmission line, and a first variable delay element coupled to the first IO pad module to delay signals transmitted over the first outside transmission line based on an actually measured transmission time of a first test signal that is transmitted and reflected over the first outside transmission line.

The IC chip may measure the transmission time during a calibration stage. The IC chip may drive the first test signal for transmission over the first outside transmission line, and measure a timing of the first test signal reflected over the first outside transmission line.

According to the disclosure, the IC chip may include a detector configured to detect the first test signal reflected over the first outside transmission line based on a voltage level on the first IO pad module in order to measure a total transmission time of the first test signal transmitted over the first outside transmission line. Further, the detector may include a comparator configured to compare the voltage level on the first IO pad module with a reference voltage.

Additionally, the detector can detect the first test signal before transmission over the first transmission line in order to measure a transmission time within the IC chip for the first test signal. Accordingly, the detector may include a comparator configured to compare the voltage level on the first IO pad module with a first reference voltage to detect the first test signal before transmission, and compare the voltage level on the first IO pad module with a second reference voltage to detect the first test signal reflected over the first outside transmission line.

Accordingly to an embodiment of the disclosure, the first variable delay element can be located on at least one of an output path for outputting signals onto the first outside transmission line, and an input path for receiving signals from the first outside transmission line.

According to the disclosure, the IC chip may include a second IO pad module coupled to a second outside transmission line, and a second variable delay element coupled to the second IO pad module to delay signals transmitted over the second outside transmission line based on an actually measured transmission time of a second test signal that is transmitted and reflected over the second outside transmission line, and the actually measured transmission time of the first test signal, in order to align the signals transmitted over the second outside transmission line with the signals transmitted over the first outside transmission line in a desired manner.

Aspects of the disclosure can provide a method for tuning delay. The method can include driving, during a calibration stage, at least one test signal from an integrated circuit onto a plurality of outside transmission lines that are coupled to the integrated circuit, measuring a timing of the at least one test signal transmitted and reflected over the plurality of outside transmission lines, and selectively delaying signals subsequently transmitted over the plurality of outside transmission lines based on the timing of the at least one test signal, in order to align transmission times of the subsequently transmitted signals.

To measure the timing of the test signal transmitted and reflected over the plurality of outside transmission lines, the method can include comparing a voltage level at an interface of the integrated circuit with a first reference voltage, detecting the test signal reflected over the plurality of outside transmission lines, and measuring a total time of the test signal transmitted and reflected over the plurality of outside transmission lines.

Further, the method can include comparing the voltage level at the interface of the integrated circuit with a second reference voltage, detecting the test signal before transmission over the plurality of outside transmission lines, measuring a transmission time within the integrated circuit for the test signal, calculating a difference of the total time and the transmission time within the integrated circuit.

To selectively delay the signals subsequently transmitted over the plurality of outside transmission lines, the method can include delaying signals for transmission from the integrated circuit to the plurality of outside transmission lines. Alternatively, the method can include delaying signals received by the integrated circuit over the plurality of outside transmission lines.

Additionally, the method can include configuring the plurality of outside transmission lines in an open configuration during the calibration stage.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
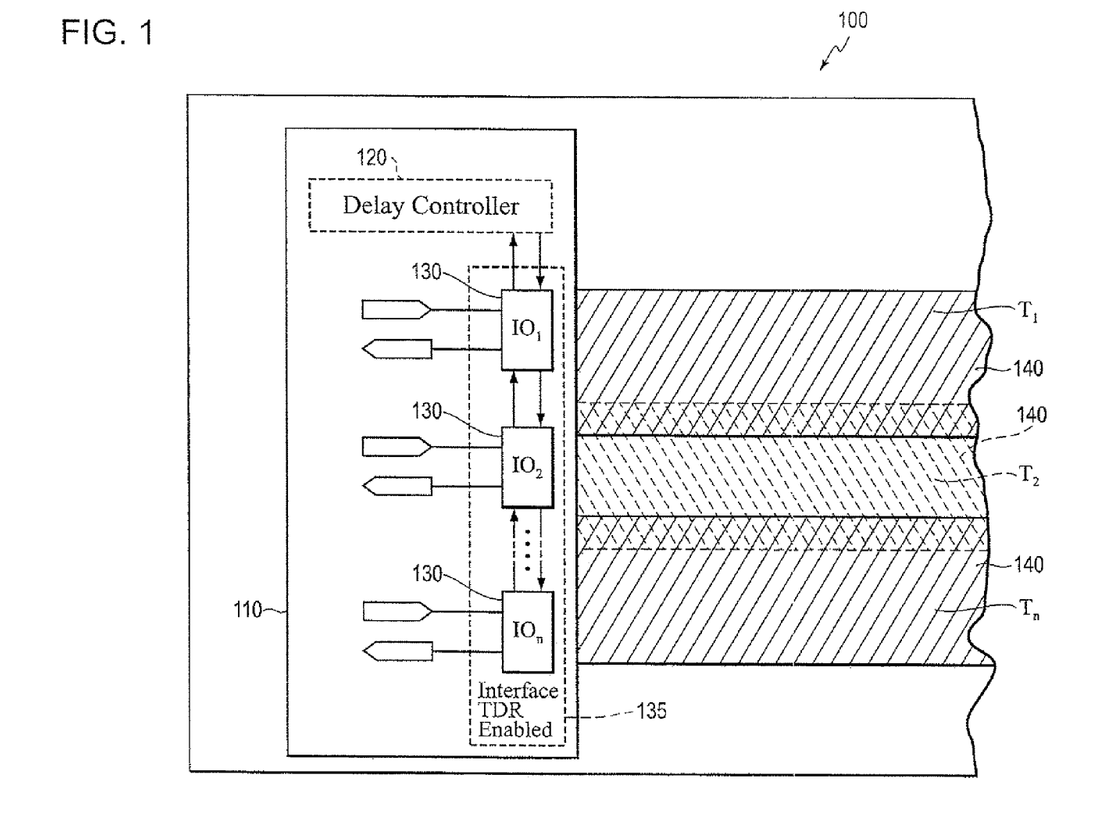
FIG. 1 shows a diagram of a printed circuit board (PCB) example.

FIG. 1 shows a simplified illustration of portion of a printed circuit board (PCB) 100 according to the disclosure. The PCB 100 may include an integrated circuit (IC) chip 110, and transmission links 140. These elements can be coupled together as shown in FIG. 1. It is noted that the printed circuit board 100 may include more than one IC chip, and may include other devices, such as discrete semiconductor devices, switches, connectors, and the like.

The transmission links 140 can transmit signals between the IC chip 110 and other devices, for example. Each transmission link 140 may include a first end and a second end. The first end can be coupled to the IC chip 110. The second end can be coupled to the other devices. The other devices may be situated on the PCB 100, or may be situated off the PCB 100, for example on another PCB.

The transmission links 140 may include a plurality of sections. In the example of FIG. 1, the transmission lines 140 may include a first section of printed metal lines T1-Tn on the PCB 100 that can transmit signals between the IC chip 110 and another device on the IC chip 110, such as a connector of the PCB 100. The printed metal lines T1-Tn may be located in different layers of the PCB 100. For example, the transmission links T1 and Tn may be located in a first layer, and the transmission link T2 may be located in a second layer. The printed metal lines T1-Tn may be located in the same layer, in which case typically, however, they would be spatially spaced.

Further, the transmission links 140 may include a second section (not shown), such as copper wires, that may transmit signals between the connector of the PCB 100 and a connector of another PCB (not shown). In addition, the transmission links 140 may include a third section of printed metal lines (not shown) that can transmit signals between the connector of the another PCB to another IC chip (not shown) on the another PCB.

Due to various reasons, such as space limitation, routing complexity, and the like, the transmission links 140 may have different attributes, such as having different lengths, being located in different layers passage (or non-passage) through vias, and the like. Therefore, signals transmitted over the transmission links 140 may have different transmission line delays, resulting, for example, from their different lengths, passage through vias, resistance that may be inherent with a given layer, and the like.

The IC chip 110 may include an interface 135 between internal circuits of the IC chip 110 and the transmission links 140. The interface 135 can include a plurality of input/output (IO) units 130. According to the disclosure, the interface 135 can include circuits that can provide or enable a delay measurement, such as a delay measurement based on time domain reflectometer (TDR).

An IO unit 130 may include a pad, suitable input circuits, and suitable output circuits. The pad can be electrically coupled to a transmission link 140 outside the IC chip 110. The input circuits may be configured to receive a signal from the pad, and may suitably regulate the received signal. According to the disclosure, the input circuits may include a delay regulation element, which can adjust a delay of the input signal based on delay measurements based on TDR.

According to an embodiment of the disclosure, delays of input signals from multiple IO units 130 of the interface 135 can be regulated according to delay measurements based on TDR. In an embodiment, delays of the input signals are regulated at least partly based on TDR measurements to compensate for the transmission line delay differences of transmission links 140, such that the input signals may be substantially synchronous, or otherwise aligned in a desirable manner, when arrive at the internal circuits of the IC chip 110.

Additionally, the input circuits may include other suitable circuits. For example, the input circuits may include a voltage regulation unit, which may convert the voltage levels of the received signals to voltage levels used in the IC chip 110. In another example, the input circuits may include protection circuits, such as electrostatic discharge protection circuits, and the like.

The output circuits may include driving circuits that can drive an output signal to the transmission link 140. According to the disclosure, a delay of the output signal can be regulated, for example, by a delay regulation element (not shown), according to the delay measurements at least partly based on TDR. According to an embodiment of the disclosure, delays of output signals from multiple IO units 130 of the interface 135 can be regulated according to the delay measurements based on TDR. The delays of the output signals may be regulated to compensate for the transmission line delay differences of transmission links 140, such that the output signals may be substantially synchronous, or otherwise suitably aligned in a desirable manner, when they arrive at the second ends of the transmission links 140.

In an example, the IC chip 110 may output one byte, which can include eight bits, in parallel from eight IO units 130 onto the first ends of eight transmission links 140, respectively. The second ends of the eight transmission links 140 may be coupled to a second IC chip. The second IC chip may use a clock signal to sample the eight transmitted signals to obtain the one byte. According to the disclosure, delays of the eight bits output from the eight IO units 130 can be regulated by the delay regulation elements in the output circuits, for example to compensate for transmission delay differences of the eight transmission links 140. Therefore, the eight transmitted signals can arrive at the second ends of the eight transmission links 140 at substantially the same time, or in other desired mutual alignment. Arrival of the eight transmitted signals at the second IC device may be adjusted, to be substantially synchronous, for example, so that the second IC device is able to sample the eight transmitted signals with reduced complexity and increased accuracy.

According to an embodiment of the disclosure, the IC chip 110 may include a delay controller 120. The delay controller 120 can be coupled to the plurality of IO units 130 of the interface 135. The delay controller 120 can receive signals from the plurality of IO units 130 corresponding to delay measurements based on TDR, and can configure the delay regulation elements in the input circuits and the output circuits of the plurality of IO units 130 based on the received signals.

In another embodiment, a delay controller 120 may be located outside of the IC chip 110, and can be coupled to the IC chip 110, for example, at a configuration time to perform the above functions. In another embodiment, the delay controller 120 can configure delay regulation elements in an IC chip based on signals received from another IC chip. For example, the delay controller 120 may receive signals from an IC chip corresponding to a system design, which can include the IC chip and a PCB where the IC chip is coupled to transmission links. The delay controller 120 may configure other IC chips that may be utilized in the same system design.

During operation, the plurality of IO units 130 and the transmission links 140 may be configured initially. For example, the delay controller 120 may configure the delay regulation elements of the plurality of IO units 130 according to a default configuration. In addition, the transmission links 140 may be configured to facilitate TDR, for example, in an open configuration.

Then, delay measurements can be performed for the plurality of IO units 130 based on TDR, respectively. More specifically, a signal can be initialized for transmission from an IO unit 130. The signal can be transmitted over the IO unit 130 and the transmission link 140, and then reflected. The reflected signal can be detected at the IO unit 130. Further, the IO unit 130 can inform the delay controller 120 regarding the detection of the reflected signal. Then, the delay controller 120 may configure the delay regulation elements in the input circuits and the output circuits of the plurality of IO units 130 based on the detection information received from the plurality of IO units 130.

Figure 2:
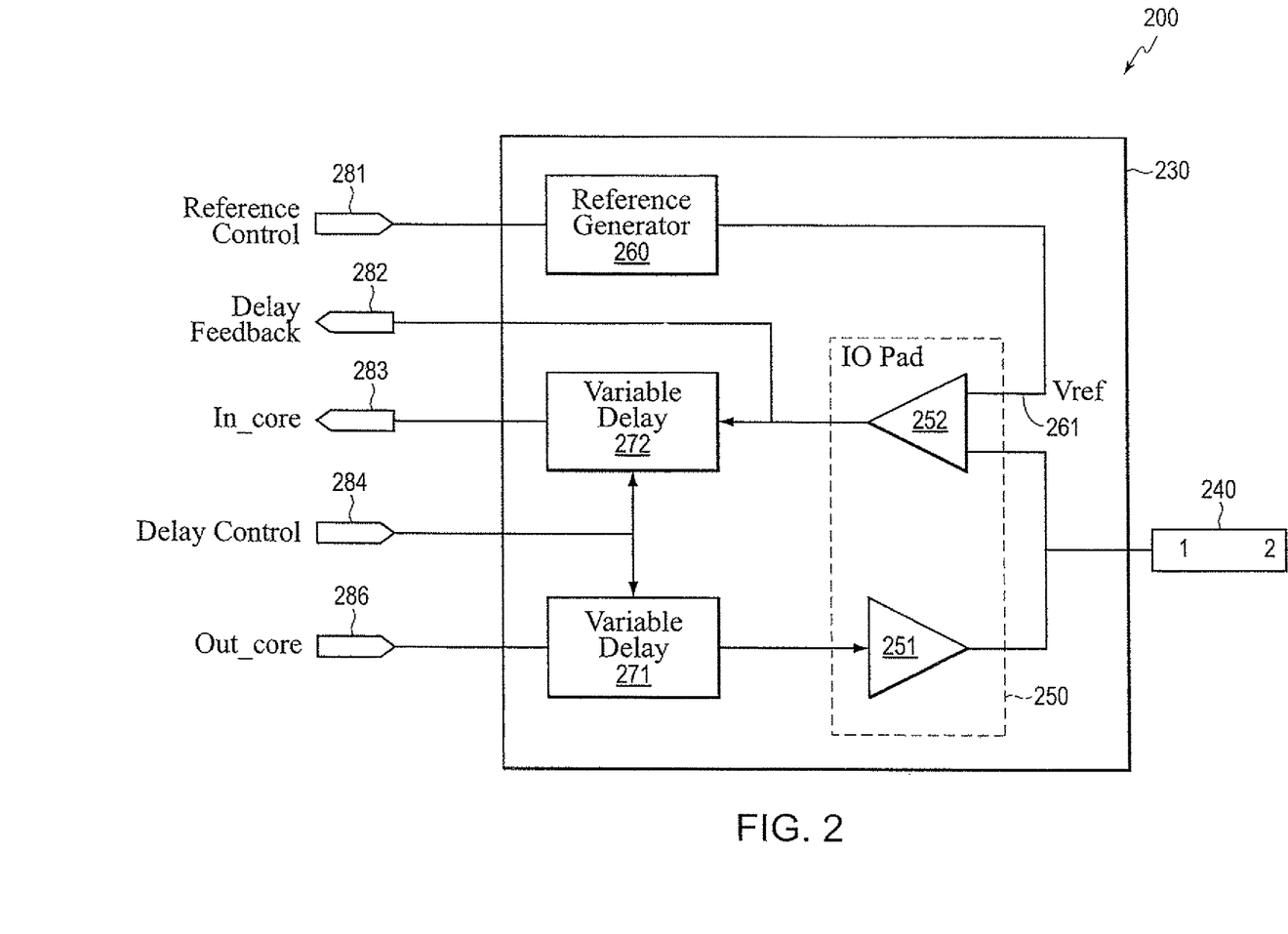
FIG. 2 shows a block diagram of an input/output (IO) unit example.

FIG. 2 shows a block diagram of an input/output (IO) unit 230 in accordance with an embodiment of the present disclosure. The IO unit 230 can be included in an IC chip, such as the IC chip 110, to provide an interface between internal circuits of the IC chip and a transmission link 240. The IO unit 230 can include an IO pad module 250, a reference generator 260, and one or more variable delay elements 271-272. These elements can be coupled together as shown in FIG. 2.

The IO pad module 250 can include an IO pad and peripheral circuits of the IO pad, such as a buffer 251, a comparator 252, and the like. The buffer 251 can be configured to have a large driving capability, to drive an output signal to the transmission link 240. The comparator 252 can be configured to compare a voltage on the IO pad to a reference voltage to determine an input signal. For example, when the voltage on the IO pad is smaller than the reference voltage, the comparator 252 can output "0". Otherwise, the comparator 252 can output "1".

The reference generator 260 may be configured to generate one or more reference signals. For example, the reference generator 260 may generate and provide a reference voltage 261 to the comparator 252. In an embodiment, the reference generator 260 may generate the reference voltage 261 with regard to a reference control 281, for example, from a controller, such as the delay controller 120.

Each variable delay element 271-272 can receive a signal, regulate the signal with a configurable delay, and output the delayed signal. In an embodiment, the variable delay element 271 can be inserted along an output path of the IO unit 230, such as between an out_core 286 of the internal circuits and the buffer 251 as shown in FIG. 2. The variable delay element 271 along the output path can regulate a delay of an output signal. In another embodiment, the variable delay element 272 can be inserted along an input path of the IO unit 230, such as between the comparator 252 and an in_core 283 of the internal circuits as shown in FIG. 2. The variable delay element 272 along the input path can regulate a delay of an input signal.

According to the disclosure, the one or more variable delay elements 271-272 can be configured by one or more delay controls 284. In an embodiment, each variable delay element 271-272 may be configured by a respective delay control 284. In another embodiment, the variable delay elements 271 and 272 can be configured by a common delay control 284. The one or more delay controls 284 can be provided by a controller, such as the delay controller 120, based on a delay feedback 282 generated by the IO unit 230.

According to the disclosure, the delay feedback 282 can be generated based on TDR during a calibration process. During the calibration process, the IO unit 230 can be configured initially of an initial configuration. For example, the variable delay elements 271-272 may receive the delay control 284 of a default value, and can be configured to have an initial delay. The reference generator may generate a TDR reference voltage 261 for the comparator 252 to generate the delay feedback 282. In addition, the transmission link 240 can be configured to facilitate TDR. In an embodiment, the transmission link 240 can be configured in an open configuration. More specifically, while a first end of the transmission link 240 is electrically connected to the IO unit 230, a second end of the transmission link 240 is open. The open configuration can enable a large energy portion of a signal transmitted over the transmission link 240 to be reflected.

In the subsequent calibration process, the IO unit 230 may receive an output signal from the output core 286. The output signal can be regulated by the variable delay element 271 along the output path. The variable delay element 271 may regulate the output signal by the initial delay. Further, the regulated output signal can be driven by the buffer 251 to the first end of the transmission link 240 for transmission to the second end.

At the second end of the transmission link 240, the transmitted signal can be reflected according to the configuration of the transmission link 240. For example, when the transmission link 240 is in the open configuration, a large energy portion of the transmitted signal can be reflected from the second end to the first end. The reflected signal can be detected by the comparator 252. More specifically, the reflected signal may change a voltage of the IO pad 250. The voltage change can be detected by the comparator 252. The comparator 252 can compare the voltage of the IO pad to a reference voltage, and detect the voltage change based on the comparison. The comparator 252 can output a detection signal corresponding to the detection of the reflected signal. For example, the comparator 252 can output "0" for not-detecting the reflected signal, and output "1" for detecting the reflected signal. In an embodiment, the detection signal can be provided to a controller, as shown by the delay feedback 282 in FIG. 2. In another embodiment, the detection signal can be regulated by the variable delay element 272 before provided to a controller, such as the delay controller 120.

Furthermore, the delay controller 120 may determine the one or more delay control signals 284 to the IO unit 230 based on the received detection signal. In an embodiment, the controller may receive multiple detection signals corresponding to multiple IO units coupled to multiple transmission links, respectively. The controller may determine multiple delay control signals to the multiple IO units, respectively. The multiple delay control signals may configure the variable delay elements 271 on the output paths of the multiple IO units, such that the output signals can arrive at the second ends of the transmission links 240 at substantially the same time, or in accordance with some other alignment in the time domain. In addition, the multiple delay control signals may configure the variable delay elements 272 on the input paths of the multiple IO units, such that the input signals can arrive at the internal circuits at substantially the same time, or some other alignment in the time domain.

Figure 3:
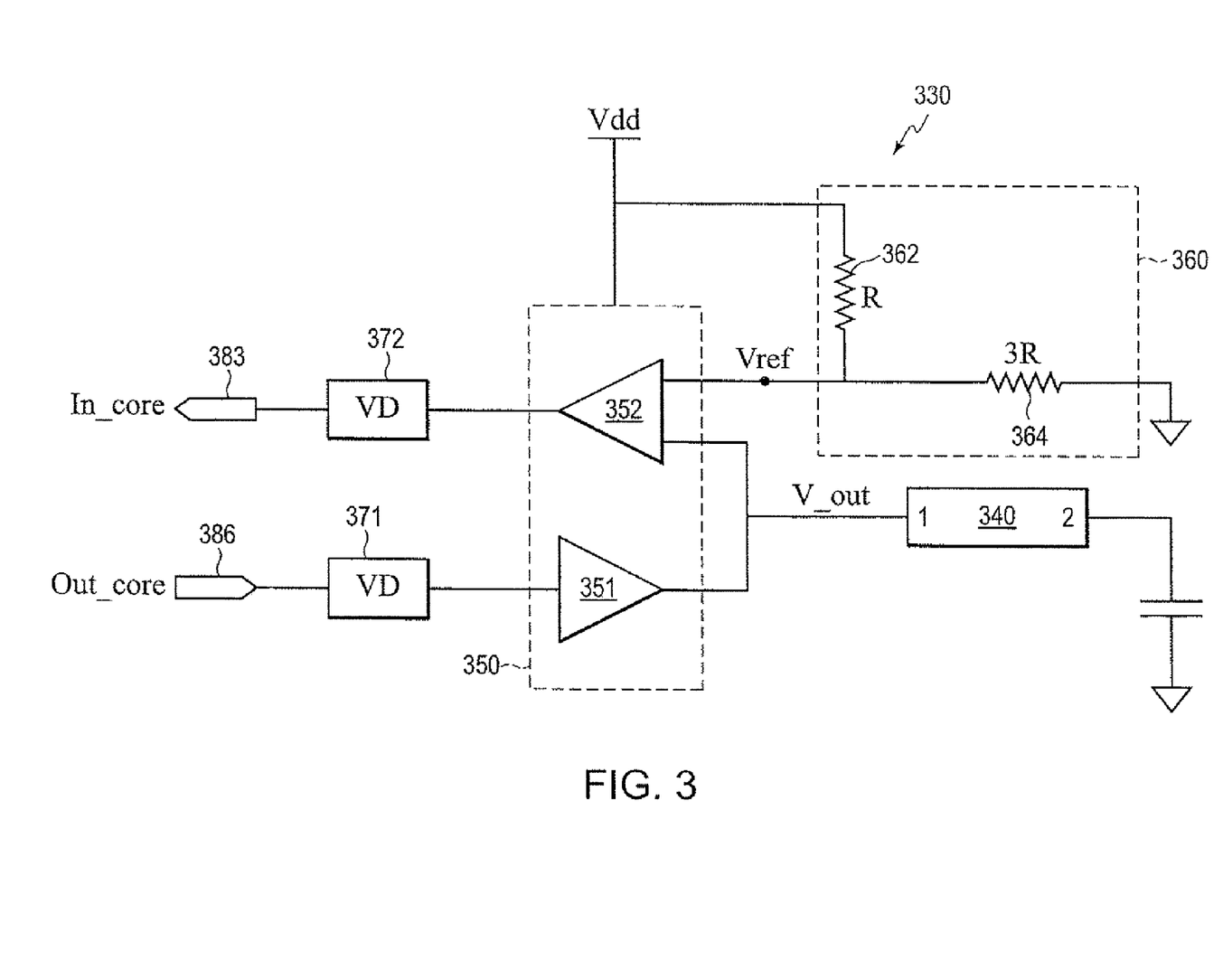
FIG. 3 shows another block diagram of an IO unit example.

FIG. 3 shows another block diagram of an IO unit example 330 coupled to a transmission link 340. The IO unit 330 can be included in an IC chip, such as the IC chip 110, to provide an interface between internal circuits of the IC chip and the transmission link 340. The IO unit 330 can include an IO pad module 350, a first variable delay element 371, a second variable delay element 372, and a reference generator 360. These elements can be coupled as shown in FIG. 3.

Similar to the IO pad module 250 in FIG. 2, the IO pad module 350 can include an IO pad and peripheral circuits of the IO pad, such as a buffer 351 for driving an output signal, and a comparator 352 for determining an input signal. These elements can be similarly configured as corresponding elements in FIG. 2.

The reference generator 360 can be configured to generate and provide a reference voltage Vref for the comparator 352. The reference generator 360 may use any suitable technique to generate the reference voltage Vref. In an embodiment, the reference generator 360 may include a first resistor module 362 and a second resistor module 364 that are serially connected between a power supply Vdd and ground, as shown in FIG. 3. The first resistor module 362 and the second resistor module 364 may have a resistance ratio that can determine the reference voltage. For example, when the resistance of the second resistor module 364 is three times of the resistance of the first resistor module 362, the reference voltage Vref is ¾ Vdd. It is noted that the reference generator 360 may be configurable. For example, the reference generator 360 may include switches that can switch resistors in or out of a resistor module to configure, for example the resistance ratio. It is also noted that the reference generator 360 may be configured by software.

The first variable delay element 371 can be located along an output path of the IO unit 330, such as between an out_core 386 of the internal circuits and the buffer 351 as shown in FIG. 3. The first variable delay element 371 along the output path can regulate a delay of an output signal. The second variable delay element 372 can be located along an input path of the unit 330, such as between the comparator 352 and an in_core 383 of the internal circuits as shown in FIG. 3. The second variable delay element 372 along the input path can regulate a delay of an input signal.

The first variable delay element 371 and the second variable delay element 372 can include configurable elements that can configure the delays of the first and second variable delay elements 371 and 372. The delays can be configured according to one or more delay control signals (not shown). The first variable delay element 371 can receive a signal from an out_core 386, regulate the signal with the configurable delay, and output the delayed signal to the buffer 351. Similarly, the variable delay element 372 can receive a signal from the comparator 352, regulate the signal with the configurable delay, and output the delayed signal to in_core 383.

During operation, the IO unit 330 can be configured initially according to an initial configuration. For example, the first and second variable delay elements 371 and 372 can be configured to have an equivalent initial delay. Further, the reference generator 360 may generate a TDR reference voltage, such as ¾ Vdd, for the comparator 352 as reference. In addition, the transmission link 340 can be configured in an open configuration as shown in FIG. 3. In the open configuration, a first end of the transmission link 340 is electrically connected to the IO unit 330 and a second end of the transmission link 340 is open.

Then, the IO unit 330 may receive a test signal, such as a test signal including a step shape from low to high, from the out_core 386. The test signal can be regulated by the variable delay element 371 according to the initial delay. Further, the regulated test signal can be driven by the buffer 351 to the first end of the transmission link 340 for transmission to the second end.

The transmitted test signal can be reflected from the second end of the transmission link 340 due to the open configuration of the transmission link 340. The reflected test signal can change the voltage at the first end of the transmission link 340, which is coupled to the IO pad module 350, and can be detected by the comparator 352. More specifically, the comparator 352 can compare the voltage on the IO pad to the reference voltage, which is ¾ Vdd, and generate a detection signal. For example, when the buffer 351 drives a step signal from zero to Vdd, the first end of the transmission link 340 can increase from 0 to ½ Vdd initially, due to the reason that the impedances of the IO unit 330 and transmission link 340 are about the same. Therefore, the comparator 352 can generate "0" as the detection signal. After the reflected test signal arrives at the first end of the transmission link 340, the voltage of the IO pad, which is electrically coupled to the first end of the transmission link 340, can increase to Vdd. Therefore, the comparator 340 can generate "1" as the detection signal. The detection signal can be regulated by the second variable delay element 372, and can be provided to in_core 383.

In an embodiment, a controller may control the test signal to the out_core 386, and can receive the detection signal from the in_core 383. The controller can adjust the first and second variable delay elements 371 and 372 based on the detection signal, more specifically, based on timings of the detection signal.

Figure 4:
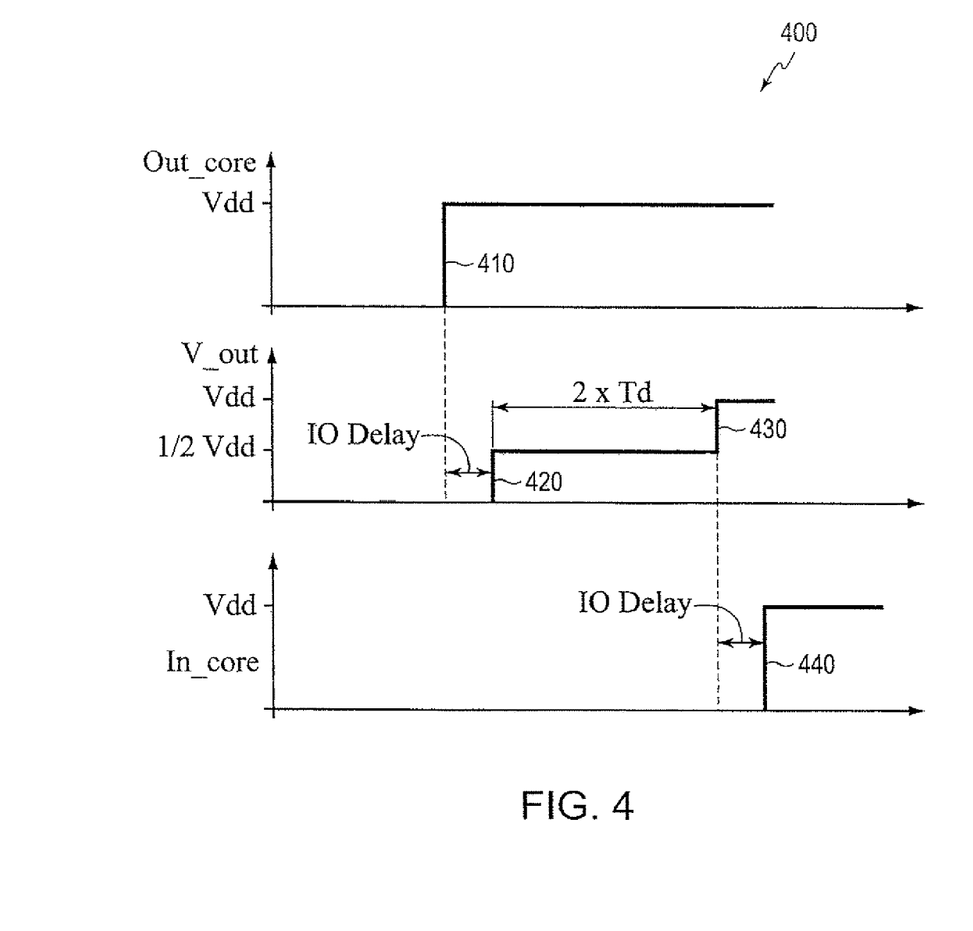
FIG. 4 shows a time tracing plot example for an IO unit example according to the disclosure.

FIG. 4 shows a time tracing plot example for the IO unit example 330 according to the disclosure. The plot 400 includes three traces, an out_core trace corresponding to the out_core 386, a V_out trace corresponding to the IO pad, and an in_core trace corresponding to the in_core 383.

The out_core trace indicates a test signal having a step shape, which increases from zero to Vdd at 410. The test signal can be delayed, and may arrive at the IO pad with an IO delay, as indicated by 420 in FIG. 4. Further, the test signal can be transmitted over the transmission link 340, and can be reflected from the second end of the transmission link 340. The reflected test signal can return to the IO pad, and can change a voltage level of the IO pad, as indicated by 430 in FIG. 4. The reflected test signal can be detected by the comparator 352, which may generate a detection signal. The detection signal may be delayed and received at the in_core 383, as indicated by 440 in FIG. 4.

As can be seen in FIG. 4, the total time duration from the voltage increase of the test signal at out_core 386, as indicated by 410, to the receipt of the detection signal at the in_core 383, as indicated by 440, can be expressed in Eq. 1:

$$\text{Time} = 2 \times (\text{IO delay} + \text{Transmission line delay}) \quad \text{Eq. 1}$$

where IO delay is the delay from the out_core 386 to the IO pad, which can be substantially equivalent to the delay from the IO pad to the in_core 383, and Transmission line delay is the one-way delay due to the transmission link 340.

In an embodiment, the controller, which can control the test signal to the out_core 386, and receive the detection signal from the in_core 383, can calculate a transmission time from an IO unit, and may adjust the variable delay elements in the IO unit to achieve a target transmission time. In another embodiment, the controller, which may control test signals to multiple IO units, and receive detection signals from the multiple IO units, can determine transmission timings of the multiple IO units, for example, by comparing the arrival sequence of the multiple detection signals, and may adjust the variable delay elements in the multiple IO units to synchronize signals transmitted in parallel, either into the multiple IO units, or out of the multiple IO units.

It is noted that the test signal in FIG. 4 uses the step shape for ease and clarity, the test signal may include any suitable shapes that the reflected test signal can be detected based on TDR.

Figure 5:
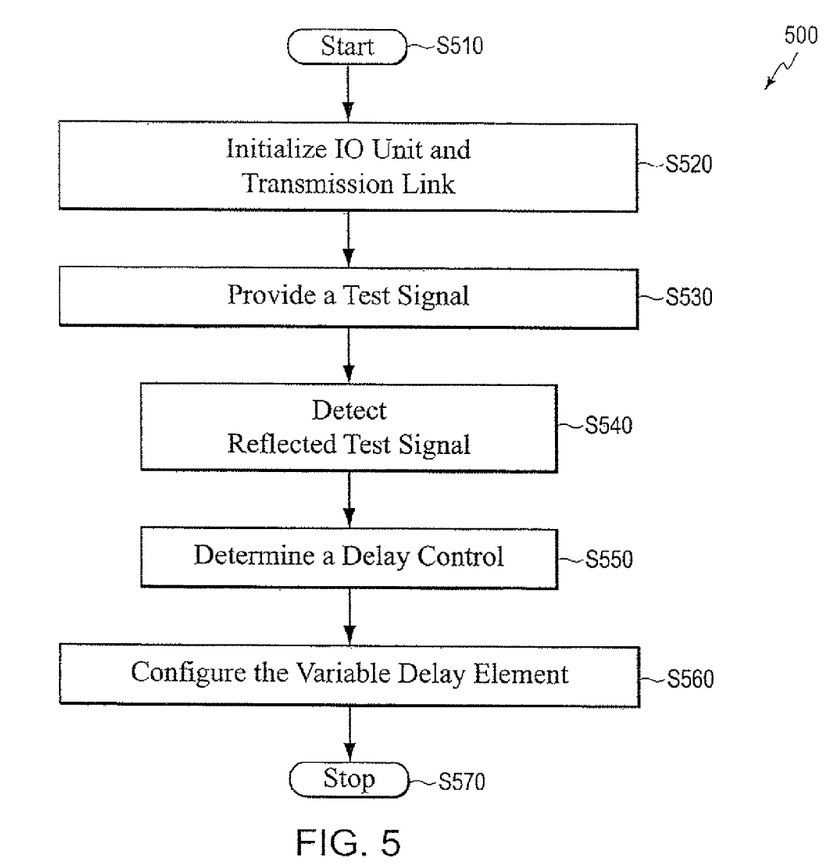
FIG. 5 shows a flowchart outlining a process example for calibrating and tuning IO delays.

FIG. 5 shows a flowchart outlining a process example 500 for calibrating and tuning delay of an IO unit. The IO unit may be located in an IC chip as an interface to a transmission link. The process starts at step S510, and proceeds to step S520.

In step S520, the IO unit and the transmission link coupled to the IO unit for transmitting signals can be configured initially. More specifically, the IO unit may include one or more variable delay elements. It is noted that a variable delay element may include any suitable analog and/or digital circuits that can be controlled to provide a variable delay. In an example, a variable delay element may include multiple stages. Each stage may include a selectable delay circuit that can be selected to delay an input signal, or can be de-selected, such that the input signal can bypass the stage. The variable delay elements can be configured to have an initial delay. Further, the transmission link may be configured to facilitate a delay measurement based on TDR. In an embodiment, the transmission link may be configured in an open configuration. In the open configuration, the transmission link may have a first end coupled to the IO unit, and a second end open. In addition, the IO unit may include a reference generator that can be configured to generate a reference signal, such as a reference voltage. Then, the process proceeds to step S530.

In step S530, a test signal can be provided to the IO unit. The test signal can be regulated by the IO unit, for example, delayed, and driven onto the first end of the transmission link. The transmission link may transmit the test signal to the second end of the transmission link, where the test signal can be reflected. In an embodiment, the second end of the transmission link is open, thus a majority energy portion can be reflected to return to the first end of the transmission link. Then, the process proceeds to step S540.

In step S540, the reflected signal can be detected. For example, the reflected signal may change a voltage level at the first end of the transmission link. The voltage change can be detected by a comparator, for example. The comparator may generate a detection signal. Then, the process proceeds to step S550.

In step S550, a delay control can be determined based on the detection signal. In an embodiment, a controller may calculate a time duration from the test signal to the detection signal, and may determine the delay control based on the time duration. In another embodiment, a controller may receive multiple detection signals from multiple IO units, respectively, and may determine the delay control signals to the multiple IO units based on the timings of the multiple detection signals. Then, the process proceeds to step S560.

In step S560, the delay control signals can be provided to the variable delay elements in the IO unit to configure the IO delays. In an embodiment, the delay control signals can be provided to the IO unit under the calibration. In another embodiment, the delay control signals can be provided to IO units of other devices, that may in the same design as the device under calibration. Then, the process proceeds to step S570, and terminates.

Figure 6:
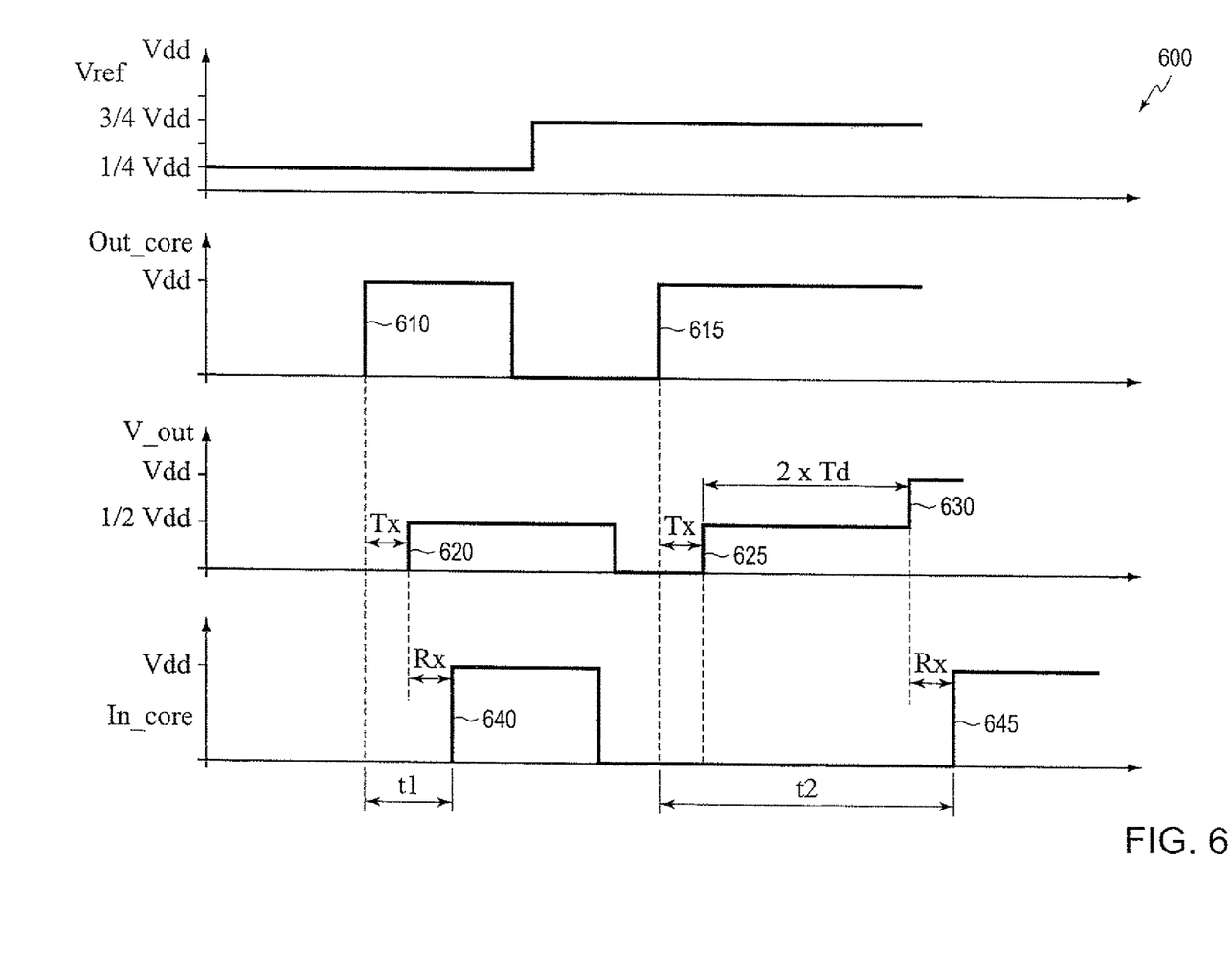
FIG. 6 shows another time tracing plot example for an IO unit example according to the disclosure.

FIG. 6 shows another time tracing plot example for the IO unit example 220 according to an embodiment of the disclosure. The plot 600 includes four traces, a Vref trace corresponding to the reference voltage 261 generated by the reference generator 260, an out_core trace corresponding to the out_core 286, a V_out trace corresponding to the IO pad, and an in_core trace corresponding to the in_core 283.

The out_core trace indicates a two-step test signal having a first step at 610, and a second step at 615. The Vref trace indicates different reference voltages for the two steps. For example, the Vref trace may have a low reference voltage, such as ¼ Vdd, for the first step 610, and may have a high reference voltage, such as ¾ Vdd, for the second step 615, as shown in FIG. 6.

During operation, the first step 610 of the test signal can be delayed, and may arrive at the IO pad with a Tx delay, as indicated by voltage step 620 in FIG. 6. Due to the low reference voltage for the first step, the voltage step 620 can be detected by the comparator 252, before transmission onto the transmission line 240, which may generate a detection signal. The detection signal can be delayed and received at the in_core 283 with a Rx delay, as indicated by voltage step 640 in FIG. 6. A time duration between the voltage step 640 and the first step 610 can be measured as t1.

The second step 615 of the test signal can also be delayed, and may arrive at the IO pad with the Tx delay, as indicated by voltage step 625. Further, the test signal can be transmitted over the transmission link 240, and can be reflected from the second end of the transmission link 240. The reflected test signal can return to the IO pad, and can further change the voltage level of the IO pad, as indicated by voltage step 630 in FIG. 6. The voltage step 630 can be detected by the comparator 252, with regard to the high reference voltage for the second step 615. The comparator 252 may generate a detection signal. The detection signal may be delayed and received at the in_core 283 with the Rx delay, as indicated by voltage step 645 in FIG. 6. A time duration between the voltage step 645 and the second step 615 can be measured as t2.

As can be seen in FIG. 6, the time duration t1 includes the Tx delay and the Rx delay, while the time duration t2 includes the Tx delay, two times of the transmission line delay over the transmission link 240, and the Rx delay. Thus, the transmission line delay of the transmission line 240 can be calculated by Eq. 2:

$$\text{Transmission line delay} = (t_2 - t_1)/2 \qquad \text{Eq. 2}$$

Figure 7:
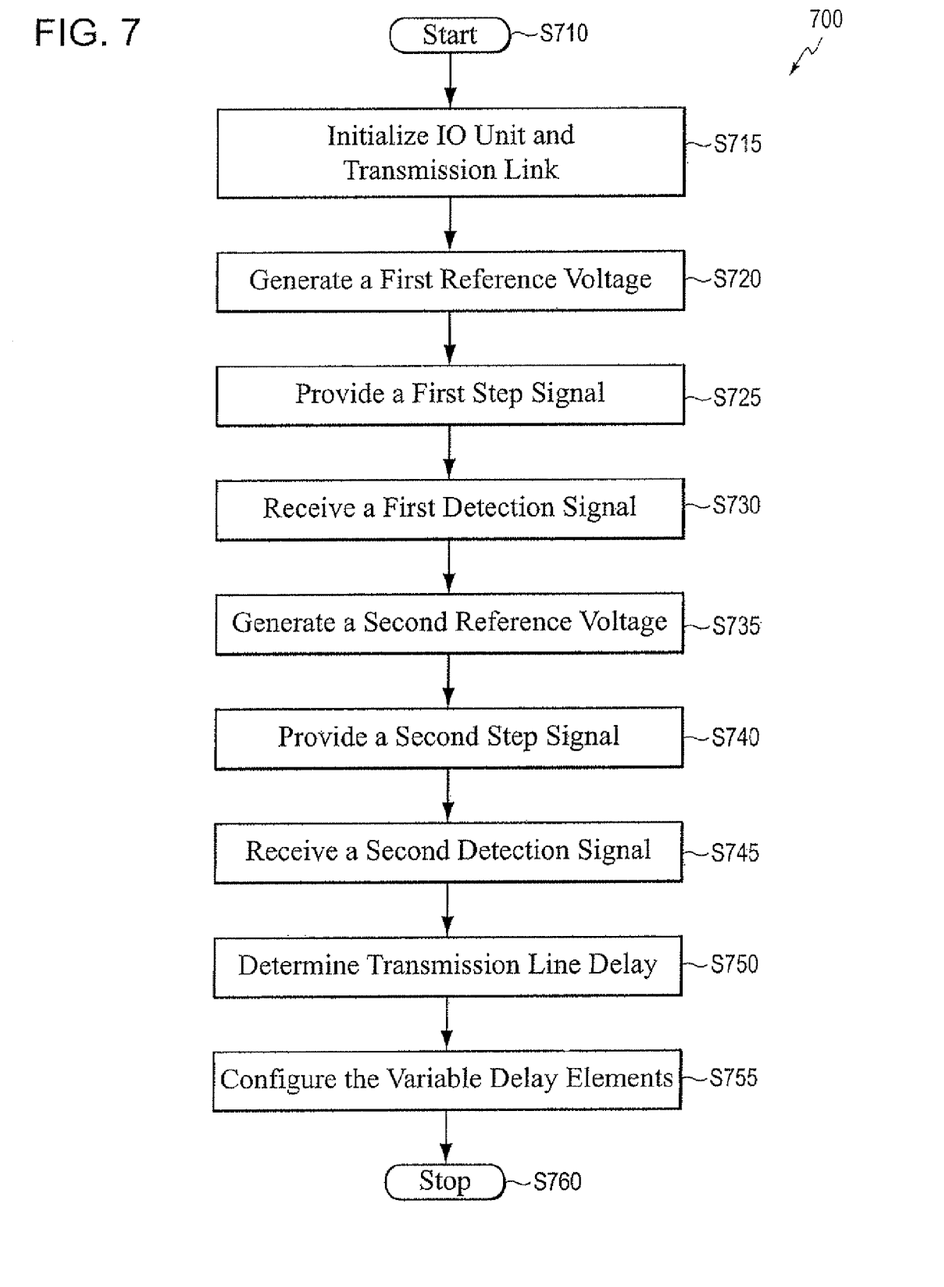
FIG. 7 shows a flowchart outlining another process example for calibrating and tuning IO delays.

FIG. 7 shows a flowchart outlining a process example 700 for calculating and tuning delay of an IO unit based on a two-step TDR measurement. The IO unit may be located in an IC chip as an interface to a transmission link. The process starts at step S710, and proceeds to step S715.

In step S715, the IO unit and the transmission link coupled to the IO unit for transmitting signals can be configured initially. More specifically, the IO unit may include one or more variable delay elements. The variable delay elements can be configured to have an initial delay. Further, the transmission link may be configured to facilitate a two-step delay measurement based on TDR. In an embodiment, the transmission link may be configured in an open configuration. In the open configuration, the transmission link may have a first end coupled to the IO unit, and a second end open. Then, the process proceeds to step S720.

In step S720, a first reference voltage, such as ¼ Vdd, can be generated and provided to the IO unit. Then, the process proceeds to step S725.

In step S725, a first step signal, such as a positive voltage step signal, can be provided to the IO unit. The first step signal can be regulated by the IO unit, for example, delayed, and driven onto the first end of the transmission link. Then, the process proceeds to step S730.

In step S730, a first detection signal, can be received. For example, the first detection signal may correspond to a detection of an IO pad voltage increase from zero to an intermediate level, such as ½ Vdd, due to the first step signal. Then, the process proceeds to step S735.

In step S735, a second reference voltage, such as ¾ Vdd, can be generated and provided to the IO unit. Then, the process proceeds to step S740.

In step S740, a second step signal, such as a positive voltage step signal, can be provided to the IO unit. The second step signal can be regulated by the IO unit, for example, delayed and driven onto the first end of the transmission link. The transmission link may transmit the second step signal to the second end of the transmission link, where the second step signal can be reflected. In an embodiment, the second end of the transmission link is open, thus a majority energy portion can be reflected to return to the first end of the transmission link. Then, the process proceeds to step S745.

In step S745, a second detection signal can be received. For example, the second detection signal may correspond to a detection of the IO pad voltage increase from the intermediate voltage to Vdd, due to the reflected second step signal. Then, the process proceeds to step S750.

In step S750, a transmission line delay can be determined based on timings of the detection signals of the first step signal and the second step signal, such as based on Eq. 2. Then, the process proceeds to step S755.

In step S755, the variable delay elements can be configured based on the transmission line delay. Then, the process proceeds to step S760, and terminates.

It is noted that the examples in FIG. 6 and FIG. 7 can be suitably modified in various aspects. For example, the first step signal and the second step signal may be adjusted to different shapes, such as negative step, positive pulse, negative pulse, and the like, respectively. In addition, the values of the first reference voltage and the second reference voltage may be suitably adjusted, such that the first detection signal and the second detection signal may respectively correspond to a total transmission time duration including an internal transmission time within the IC chip and a transmission line delay time over the transmission line 240, and a transmission time duration for the internal transmission time within the IC chip.

It is noted that the process 500 and the process 700 can be executed as a one time calibration, for example, at a time when an IC chip is initialized. In addition, the process 500 and the process 700 can be executed repetitively, for example, at a periodic basis.

It is also noted that the process 500 and the process 700 can be used as a part of a systematic solution to compensate for transmission lines delay variation. In a system, such as implemented as one or more PCB boards, the delay variation of a plurality of transmission lines can be compensate for by a silicon device that is coupled to the plurality of transmission lines.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. An interface of a device, comprising:
a plurality of connector modules coupled to a plurality of outside transmission lines, respectively, wherein each connector module is configured to measure a transmission delay of the corresponding outside transmission line by driving a test signal over the outside transmission line, and detecting the test signal reflected over the outside transmission line based on a voltage level of the connector module, the connector module further includes at least one variable delay element configured to delay transmission over the corresponding outside transmission line based on the measured transmission delay of the outside transmission line, in order to align signals transmitted by the plurality of outside transmission lines in a desired manner.

2. The interface according to claim 1, wherein the detector further comprises:
a comparator configured to compare the voltage level on the connector module with a reference voltage.

3. The interface according to claim 1, wherein the variable delay element is located on at least one of an output path configured to output signals onto the outside transmission line, and an input path configured to receive signals from the outside transmission line.

4. The interface according to claim 1, wherein each of the connector module is further configured to measure the transmission delay by subtracting the timing of the test signal reflected over the outside transmission line with a transmission timing of the test signal within the device.

5. An integrated circuit (IC) chip having the interface of claim 1, wherein a first connector module of the plurality of connector modules comprises:
a first input/output (IO) pad module coupled to a first outside transmission line; and
a first variable delay element coupled to the first IO pad module to delay signals transmitted over the first outside transmission line based on a measured transmission time of a first test signal that is transmitted and reflected over the first outside transmission line.

6. The IC chip according to claim 5, wherein the transmission time of the first test signal is measured during a calibration stage by driving the first test signal for transmission over the first outside transmission line, and measuring a timing of the first test signal reflected over the first outside transmission line.

7. The IC chip according to claim 6, wherein the first IO pad module further comprises:
   a detector configured to detect the first test signal reflected over the first outside transmission line based on a voltage level on the first IO pad module in order to measure a total transmission time of the first test signal transmitted over the first outside transmission line.

8. The IC chip according to claim 7, wherein the detector is further comprises:
   a comparator configured to compare the voltage level on the first IO pad module with a reference voltage.

9. The IC chip according to claim 7, wherein the detector is further configured to detect the first test signal before transmission over the first transmission line in order to measure a transmission time of the first test signal within the IC chip.

10. The IC chip according to claim 9, wherein the detector is further comprises:
    a comparator configured to compare the voltage level on the first IO pad module with a first reference voltage to detect the first test signal before transmission, and compare the voltage level on the first IO pad module with a second reference voltage to detect the first test signal reflected over the first outside transmission line.

11. The IC chip according to claim 5, wherein the first variable delay element is located on at least one of an output path for outputting signals onto the first outside transmission line, and an input path for receiving signals from the first outside transmission line.

12. The IC chip according to claim 5, wherein a second connector module of the plurality of connector modules comprises:
    a second IO pad module coupled to a second outside transmission line; and
    a second variable delay element coupled to the second IO pad module to delay signals transmitted over the second outside transmission line based on a measured transmission time of a second test signal that is transmitted and reflected over the second outside transmission line, and the measured transmission time of the first test signal, in order to align the signals transmitted over the second outside transmission line with the signals transmitted over the first outside transmission line in a desired manner.

* * * * *